United States Patent
Birkler et al.

(10) Patent No.: US 6,433,512 B1
(45) Date of Patent: Aug. 13, 2002

(54) POWER CONSUMPTION REPORTING BY AN ACCESSORY OF AN ELECTRONIC DEVICE

(75) Inventors: Jörgen Birkler, Bara; Kristina Ahlgren, Malmö; Magnus Patrik Svensson, Malmö; Heino Jean Wendelrup, Malmö; Christian Heyl, Sodra Sandby, all of (SE)

(73) Assignee: Telefonaktebolaget L M Ericsson (Publ) (SE)

( * ) Notice: Subject to any disclaimer, the term of this patent is extended or adjusted under 35 U.S.C. 154(b) by 0 days.

(21) Appl. No.: 09/466,654

(22) Filed: Dec. 20, 1999

Related U.S. Application Data

(60) Provisional application No. 60/117,497, filed on Jan. 27, 1999.

(51) Int. Cl.[7] .......................... H02J 7/00; G01N 27/416
(52) U.S. Cl. ...................................... 320/132; 324/427
(58) Field of Search .................... 320/132, 134, 320/136, 149; 324/427

(56) References Cited

U.S. PATENT DOCUMENTS

| | | | |
|---|---|---|---|
| 5,248,929 A | 9/1993 | Burke | 320/48 |
| 5,333,176 A | 7/1994 | Burke et al. | 379/58 |
| 5,455,499 A | 10/1995 | Uskali et al. | 320/43 |
| 5,606,242 A | 2/1997 | Hull et al. | 320/48 |
| 5,608,324 A | 3/1997 | Yoshida | 324/426 |
| 5,640,081 A | 6/1997 | Austin et al. | 320/48 |
| 5,648,717 A | 7/1997 | Uskali | 320/43 |
| 5,654,623 A * | 8/1997 | Shiga et al. | 320/106 |
| 5,739,674 A | 4/1998 | Kawahara et al. | 320/48 |
| 5,789,901 A | 8/1998 | Lomholt | 320/134 |
| 5,844,884 A | 12/1998 | Szlenski | 370/149 |

FOREIGN PATENT DOCUMENTS

| | | | |
|---|---|---|---|
| EP | 0845682 A2 * | 3/1998 | H02J/7/04 |
| EP | 0 845 682 A2 | 6/1998 | |
| JP | 6021867 A | 1/1994 | |
| JP | 7046178 A | 2/1995 | |
| JP | 7321724 A | 12/1995 | |

OTHER PUBLICATIONS

International Search Report for corresponding PCT application No. PCT/SE00/00141 dated Aug. 30, 2000.

* cited by examiner

*Primary Examiner*—Gregory J. Toatley, Jr.
(74) *Attorney, Agent, or Firm*—Jenkens & Gilchrist

(57) ABSTRACT

A method, system, and apparatus enables an electronic device in communication with an accessory to accurately report a remaining battery life when the accessory provides information relating to a power usage to the electronic device. In one embodiment, the accessory draws power from a battery of the electronic device, and the electronic device is able to more accurately estimate a remaining battery life by considering the power usage information provided from the accessory. The electronic device may thereafter indicate to a user the remaining battery life. In one alternative of this embodiment, the information relating to the power usage is in the form of a current consumption of the accessory. In another embodiment, the electronic device indicates a remaining battery life of a battery of an accessory.

36 Claims, 8 Drawing Sheets

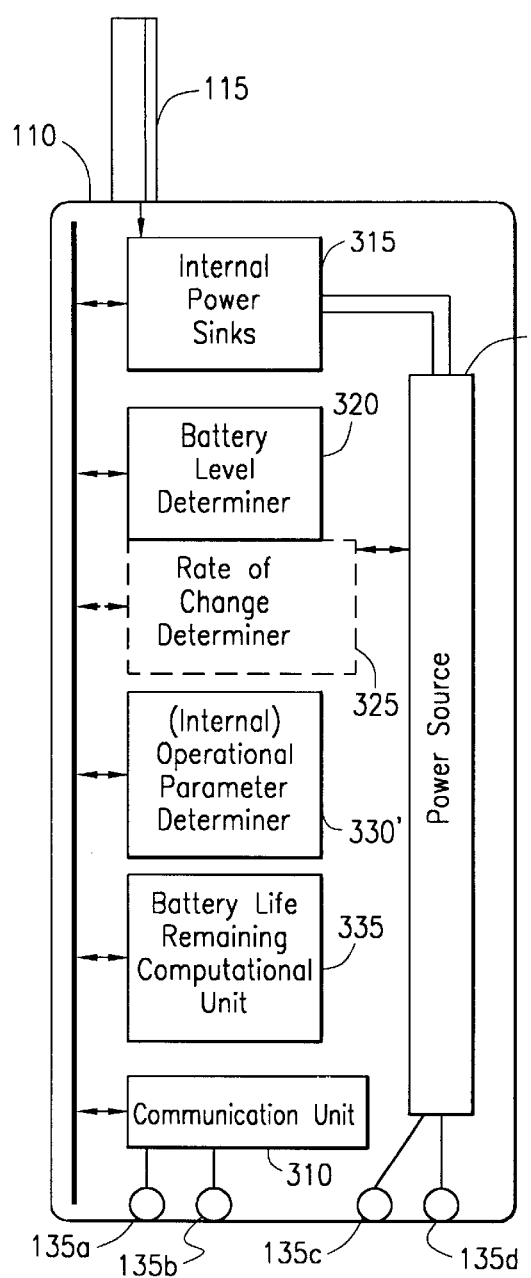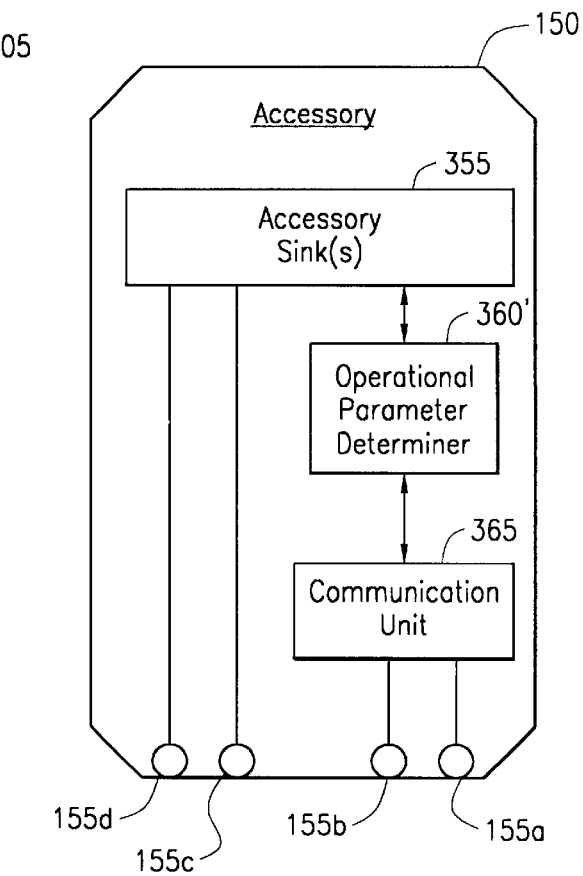
FIG. 3C
FIG. 3D
FIG. 3E
FIG. 3F

EXEMPLARY COMMAND SYNTAX

450

| Description | Command | Possible Responses |
|---|---|---|
| Reports the contemporaneous current consumption to the mobile terminal | AT*ECUR=<mamp> | • OK<br><br>• ERROR |
| Indicates if the command is supported or not | AT*ECUR=? | • OK<br>• ERROR |

460

<mamp> : parameter

| <mamp> | Description |
|---|---|
| integer | Number of milliamps, multiplied by 10.<br>(e.g., a value of 12 milliamps is reported as "120".)<br>Exemplary Range : 0–65535.<br>NOTE: The range may also be bound by physical limitations |

470

Example of an AT Command Exchange

| AT Command | Response | Comment |
|---|---|---|
| AT*ECUR=120 | OK | Report 12mA to the mobile terminal |

480

*FIG. 4B*

POWER CONSUMPTION REPORTING BY AN ACCESSORY OF AN ELECTRONIC DEVICE

CROSS-REFERENCES TO RELATED APPLICATIONS

This Application for Patent claims the benefit of priority from, and hereby incorporates by reference herein the entire disclosure of, co-pending U.S. Provisional Application for Patent Serial No. 60/117,497, filed Jan. 27, 1999.

BACKGROUND OF THE INVENTION

1. Technical Field of the Invention

The present invention relates in general to the field of power consumption in portable electronic devices, and in particular, by way of example but not limitation, to determining remaining battery power when one or more accessories is connected to a mobile terminal or other electronic device.

2. Description of Related Art

Many types of electronic devices utilize battery power instead of or in addition to A/C power from a socket. For example, laptop computers, mobile terminals, camcorders, etc. usually operate on battery power. Some of these electronic devices (e.g., especially mobile terminals) attempt to communicate to the user the time remaining for which the electronic device may be operated using the current battery before the battery is completely (or virtually completely) depleted.

Users of mobile terminals and other electronic devices typically wish to know the operational time remaining with an installed battery in order to plan properly for the eventual depletion of the battery and consequential loss of functioning of the device. For example, a user of a mobile terminal may wish to finish a current call, reach a destination in a car, transmit a document, or otherwise properly budget the remaining battery life in order to meet a desired objective. A user of a camcorder, as an additional example, may wish to complete the recording of a special event, the viewing of a tape at a remote location, etc.

Providing a user with an accurate estimate of remaining battery life requires that a current power drain be determined. Unfortunately, this determination can be difficult, especially as the number and type of power drains on a battery of an electronic device proliferate. There is therefore a need, that is heretofore unrecognized (much less satisfied), to determine an accurate current drain on a battery of an electronic device when the electronic device is connected to one or more accessories that also draw power from the battery of the electronic device in order for the remaining battery life to be accurately predicted. There is also a need, that is heretofore unrecognized (much less satisfied), to report a remaining battery life of a battery of an accessory, especially for those accessories that lack any ability to directly communicate a remaining battery life to a user.

SUMMARY OF THE INVENTION

The deficiencies of the prior art are overcome by the method, system, and apparatus of the present invention. For example, as heretofore unrecognized, it would be beneficial if an electronic device were aware of the current drain by a connected accessory in order to properly estimate an operational time remaining for the battery of the electronic device. In fact, it would be beneficial if the accessory connected to the electronic device communicated to the electronic device information representative of the current drain by the connected accessory.

In one embodiment, the accessory(ies) are connected to an electronic device and derive power from a battery of the electronic device. The accessory reports information regarding the power consumed by the accessory to the electronic device. The electronic device may then include the information in a determination of remaining battery life, which may be subsequently communicated to the user. In one alternative of this embodiment, the accessory monitors its operational parameters and derives a current draw therefrom. This current draw is reported to the electronic device. Other alternatives are described below in the Detailed Description.

In another embodiment, accessory(ies) are connected to an electronic device, but the accessory(ies) have access to an independent power supply (e.g., include their own battery). If the accessory does not have an ability to directly communicate to a user the remaining battery life of its battery, then the accessory may communicate information regarding the remaining battery life to the electronic device, which subsequently communicates the remaining battery life of the accessory to the user. This information may be in any of many forms, as explained in greater detail below.

The technical advantages of the present invention include, but are not limited to, the following. It should be understood that particular embodiments may not involve any, much less all, of the following exemplary technical advantages.

An important technical advantage of the present invention is that it enables a more accurate estimate of remaining battery life of an electronic device.

Another important technical advantage of the present invention is that it provides the ability to estimate the total power consumption for both the electronic device and an accessory connected to the electronic device.

Yet another important technical advantage of the present invention is that it improves the estimation of standby time in, for example, a mobile terminal electronic device.

Yet another important technical advantage of the present invention is the ability to optimally communicate to a user the remaining battery life for an accessory that may be unable to directly communicate the remaining battery life to the user.

The above-described and other features of the present invention are explained in detail hereinafter with reference to the illustrative examples shown in the accompanying drawings. Those skilled in the art will appreciate that the described embodiments are provided for purposes of illustration and understanding and that numerous equivalent embodiments are contemplated herein.

It shall be emphasized that the term "comprises/comprising" when used in this specification is taken to specify the presence of stated features, integers, steps, components, etc., but the term does not preclude the presence or addition of one or more other features, integers, steps, components, groups thereof, etc.

BRIEF DESCRIPTION OF THE DRAWINGS

A more complete understanding of the method and system of the present invention may be had by reference to the following detailed description when taken in conjunction with the accompanying drawings wherein:

FIG. 3C illustrates exemplary functional blocks of another exemplary mobile terminal in accordance with the present invention;

FIG. 3D illustrates exemplary functional blocks of another exemplary accessory in accordance with the present invention;

FIG. 3E illustrates an exemplary memory element of the exemplary mobile terminal of FIG. 3C in accordance with the present invention;

FIG. 3F illustrates an exemplary memory element of the exemplary accessory of FIG. 3D in accordance with the present invention;

FIG. 4B illustrates an exemplary command structure for exchanging signals/information between the mobile terminal and the accessory of FIG. 4A in accordance with certain embodiments of the present invention;

DETAILED DESCRIPTION OF THE DRAWINGS

Figure 1:
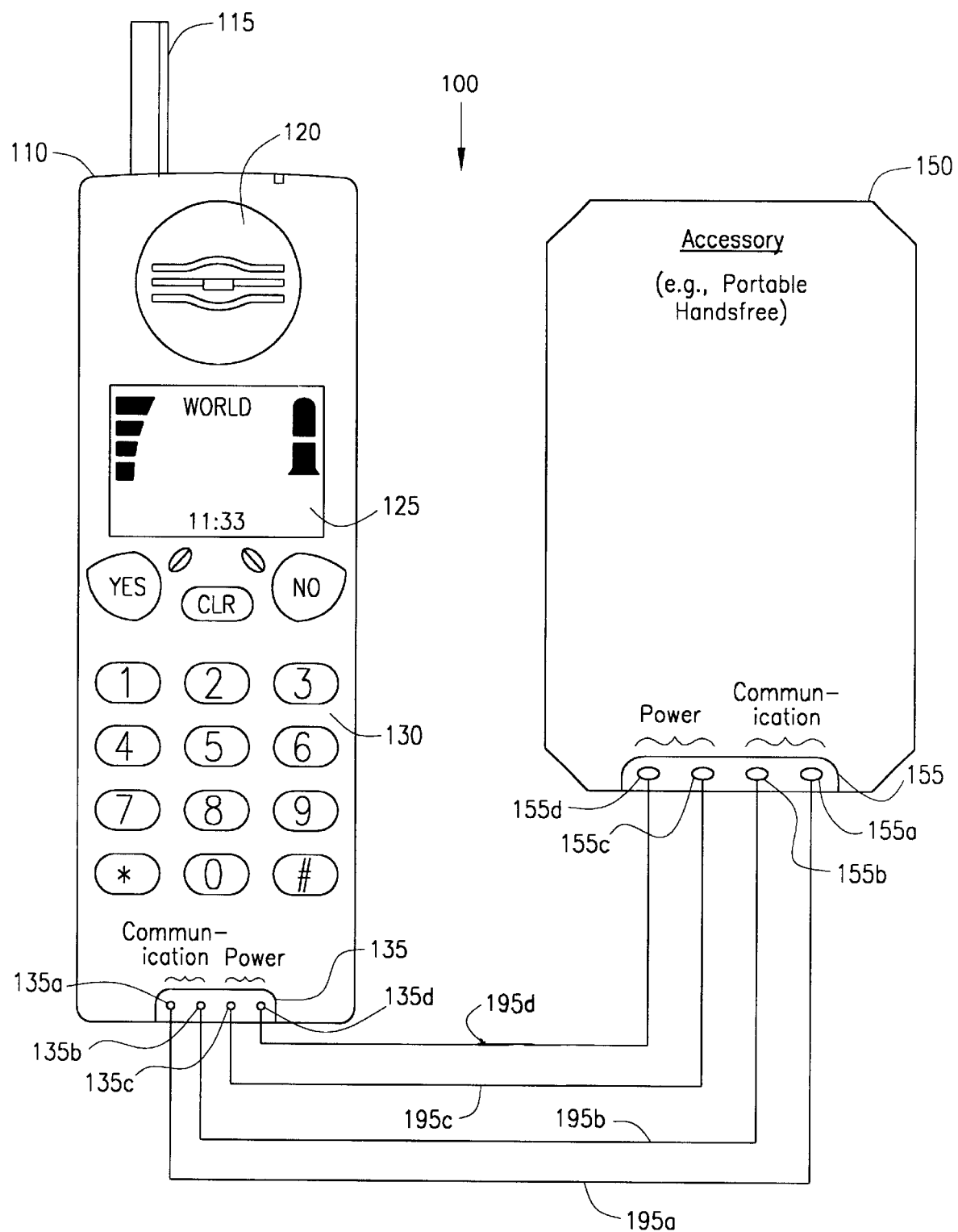
FIG. 1 illustrates an exemplary diagram of a mobile terminal connected to an exemplary accessory in accordance with the present invention.

In the following description, for purposes of explanation and not limitation, specific details are set forth, such as particular circuits, logic modules (implemented in, for example, software, hardware, firmware, etc.), techniques, etc. in order to provide a thorough understanding of the invention. However, it will be apparent to one of ordinary skill in the art that the present invention may be practiced in other embodiments that depart from these specific details. In other instances, detailed descriptions of well-known methods, devices, logical code (hardware, software, firmware, etc.), etc. are omitted so as not to obscure the description of the present invention with unnecessary detail.

A preferred embodiment of the present invention and its advantages are best understood by referring to FIGS. 1–6B of the drawings, like numerals being used for like and corresponding parts of the various drawings.

A deficiency with regard to an electronic device determining only the power that it consumes when estimating remaining battery life is that some accessories also use the electronic device's battery as a power supply. When the electronic device does not know how much current the accessory(ies) consume(s), the accuracy of the estimated power consumption will consequently be too low. Certain embodiments of the present invention enable the estimation of the total power consumption for both the electronic device and an accessory connected to it.

It should be understood that although exemplary embodiment(s) are described in terms of a mobile terminal (e.g., a wireless mobile station, a computer with a wireless link, etc.), the present invention is equally applicable to electronic devices in general. Furthermore, aspects of the Global System for Mobile Communications (GSM) wireless network standard will be used to describe an embodiment of the present invention. However, it should be understood that the principles of the present invention are applicable to (in addition to other wireless communication standards (or systems)) electronic devices in general, including those that are battery-powered and to which accessories sharing the battery of the electronic device may be connected.

It should be noted that accessories for a mobile terminal may include, but are not limited to, portable handsfree implements, infrared (IR) plugs, vibrating notification implements, etc. It should also be noted that the accessory (e.g., a pager, etc.) may alternatively be physically located within the housing of a battery that supplies power to the mobile terminal or other electronic device and is removably attached thereto.

In one embodiment, the accessory or accessories report how much power they are consuming to the electronic device. Each accessory that is consuming power from the battery of the electronic device reports this to the electronic device. The information may, for example, be sent with AT commands, as described further below. Whenever the current power consumption of the accessory changes, a new report may be issued to the electronic device. Also, the accessory may send the mean value of the power consumption at some regular time interval. The accessory may derive its power consumption information by monitoring its operational parameters and knowing the corresponding current required for each operation.

Referring now to FIG. 1, an exemplary diagram of a mobile terminal 110 connected to an exemplary accessory 150 in accordance with the present invention is illustrated generally at 100. Although the mobile terminal 110 is illustrated as a hand-held mobile phone, the present invention is not to be so limited. The mobile terminal 110 includes an antenna 115, a speaker 120, a display 125, a keypad 130, and four connection/interface points/ports 135 (e.g., an external connector with one or more input pins). Two of the four connection points 135 are power connection points 135c and 135d, and two of the connection points are communication connection points 135a and 135b. It should be understood that the connection points 135 may number more or less than the four shown. Likewise, the number of communication and power connection points 135a,135b and 135c,135d may be more or less than the two shown.

The accessory 150 may be, for example, an infrared adaptor unit, a portable hands-free unit, a vibrating notification mechanism, etc. The accessory 150 is also shown as having four connection points 155, two of which are for communication (155a,155b) and the other two of which are for power (155c,155d). It should be understood that the accessory unit 150 may also have more or less than four connection points 155, and they may be distributed differently. In other words, the connection points 155 may also be for another use (e.g., in addition to communication and power). Furthermore, the number of communication points 155a,155b (or, e.g., power points 155c,155d) may be more than or less than the two shown, for example. The accessory 150 may communicate with the mobile terminal 110 over communication connection lines 195a,195b. The accessory 150, in an embodiment, receives power from a battery (not shown in FIG. 1) of the mobile terminal 110 over power connection lines 195c,195d.

Figure 2:
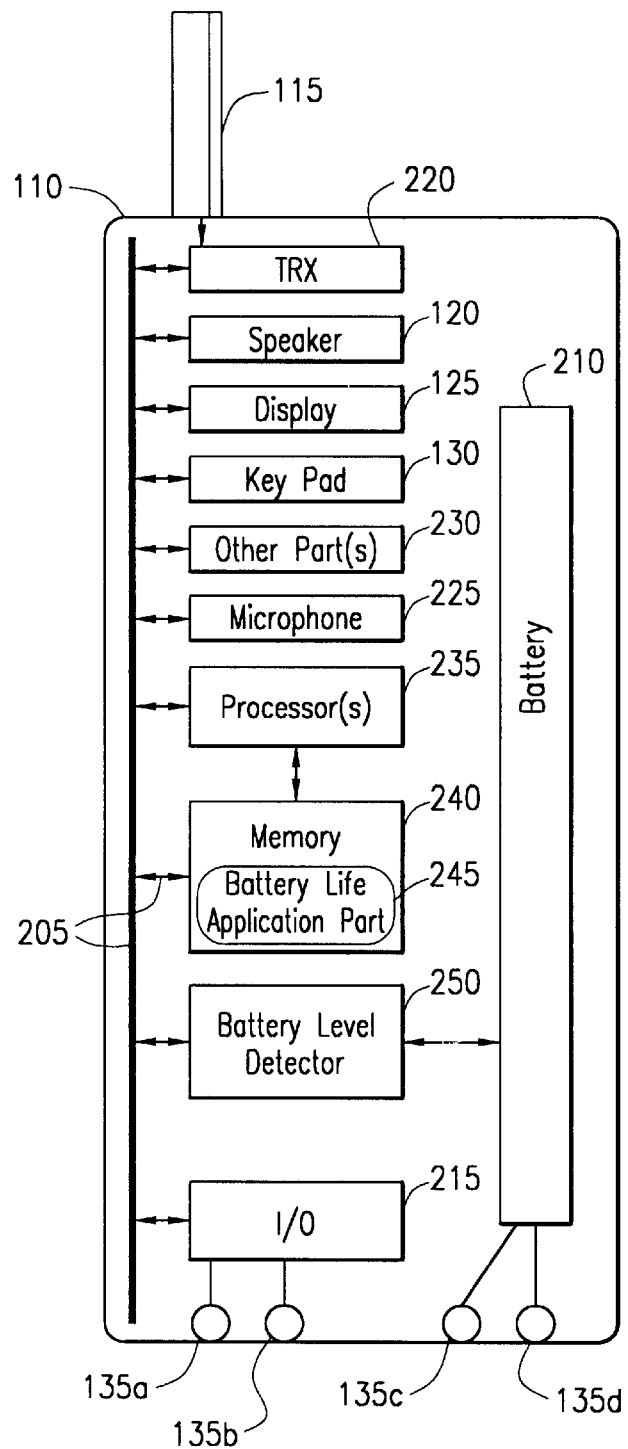
FIG. 2 illustrates exemplary internal circuitry of an exemplary mobile terminal in accordance with the present invention.

Referring now to FIG. 2, exemplary internal circuitry for an exemplary mobile terminal 110 in accordance with the present invention are illustrated. The various exemplary circuitry may be interconnected via one or more buses 205. The internal circuitry include a battery 210 that is connected to the power connection points 135c,135d and to the other internal circuitry. They also include an input/output unit 215 connected to the communication connection points 135a, 135b. Also included are a transceiver (TRX) 220, the speaker 120, the display 125, the keypad 130, a microphone 225, and perhaps various other circuits (represented generally at 230). The mobile terminal 110 also includes one or more processors 235 and one or more memories 240. Within the memory 240, in accordance with one embodiment of the present invention, a battery life application part 245 is stored. The battery life application part 245 may be, for example, encoded in hardware, software, firmware, or any combination thereof. The internal circuitry may also include a battery detector 250. The battery detector 250 includes an ability, among others, to determine a remaining total charge in the battery 210 and the current power drain of the battery 210 from internal circuitry of the mobile telephone 110.

Figure 3A:
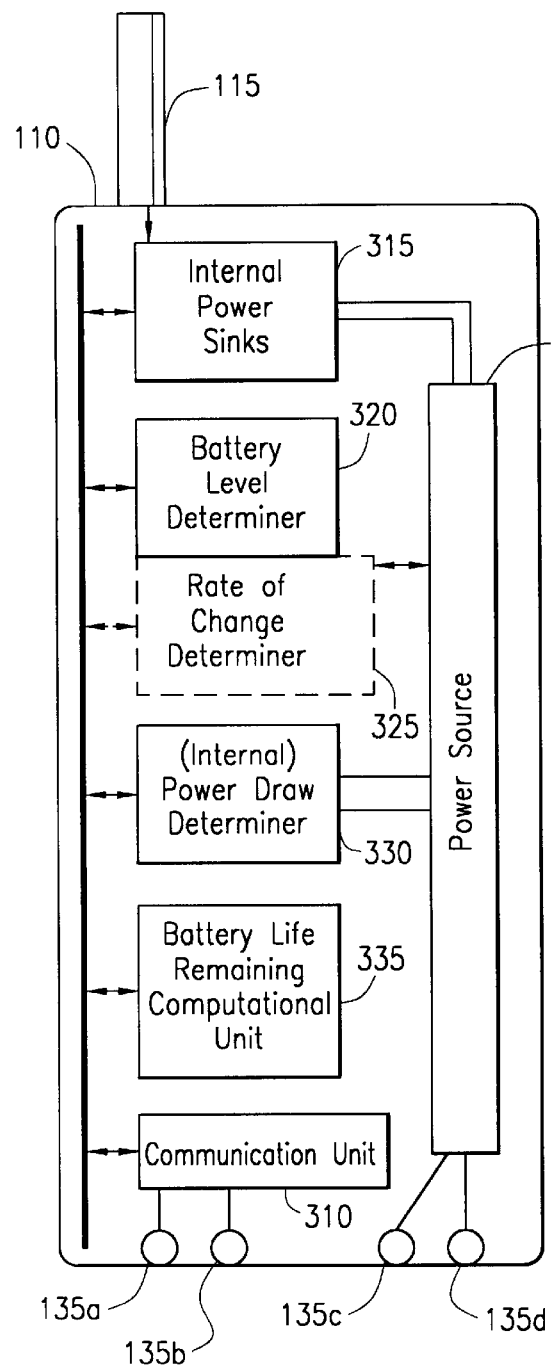
FIG. 3A illustrates exemplary functional blocks of one exemplary mobile terminal in accordance with the present invention.

Referring now to FIG. 3A, exemplary functional blocks of one exemplary mobile terminal in accordance with the present invention are illustrated. The functional blocks of FIG. 3A include a power source 305 (e.g., the battery 210 of FIG. 2) connected to the power connection points 135c,135d and a communication unit 310 connected to the communication connection points 135a,135b. They also include various internal power sinks 315 that are connected to the power source 305 and drain the power therefrom. The battery detector 250 (of FIG. 2) may correspond to a battery level determiner functional block 320 as well as an (internal) power draw determiner functional block 330. The battery level determiner 320 may determine the total charge remaining within the power source 305. The battery level determiner 320 may also include (or otherwise be associated with) a rate of change determiner functional block 325 that determines the rate at which the charge remaining in the power source 305 is being drained. The internal power draw determiner 330 may determine the power being drawn from internal circuitry by, for example, measuring the rate of consumption of current (e.g., in (milli)amps) by the internal circuitry (e.g., jointly (measure current draw by entire set of internal circuitry at once), piece-meal (measure one or more internal circuits sequentially or in parallel and then sum), etc.). The functional blocks of the mobile terminal 110 may also include a battery life remaining computational unit(s) 335. The computational unit(s) 335 may be realized as part of the battery life application part 245, the memory 240, and the processors 235 (as shown in FIG. 2). Alternatively, the computational unit(s) 335 may be, for example, a separate set of firmware along with a digital signal processor (DSP).

Figure 3B:
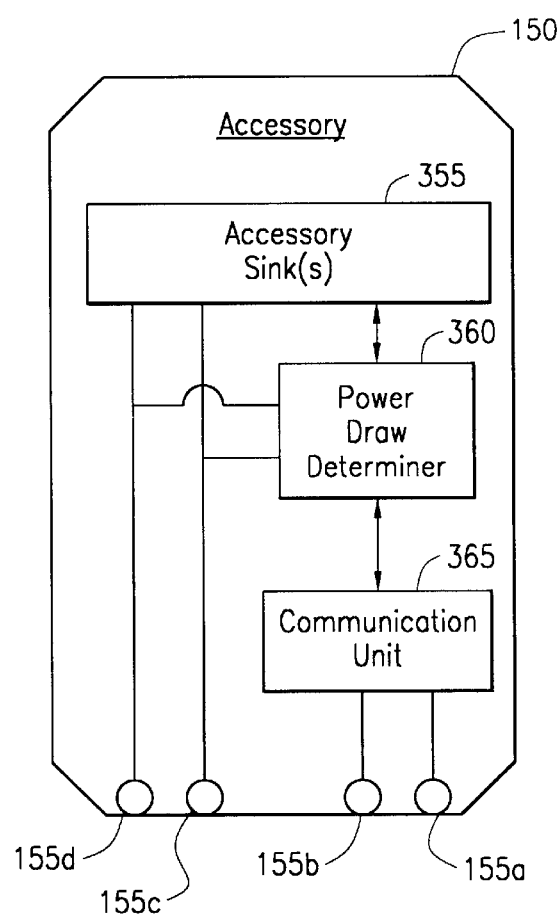
FIG. 3B illustrates exemplary functional blocks of one exemplary accessory in accordance with the present invention.

Referring now to FIG. 3B, exemplary functional blocks of one exemplary accessory in accordance with the present invention are illustrated. The exemplary functional blocks include accessory sinks 355, which draw power from the power source 305 of the mobile terminal 110 (e.g., via the power connection points 155c,155d of the accessory 150, the power connection lines 195c,195d, and the power connection points 135c,135d of the mobile terminal 110). They also include an accessory power draw determiner functional block 360. The accessory power draw determiner 360 may determine the power being extracted from the power source 305 of the mobile terminal 110 by, for example, measuring a consumption of current (e.g., in (milli)amps). The exemplary accessory 150 may also include a communication unit 365. The communication unit 365 of the accessory 150 communicates (e.g., via the communication connection points 155a,155b of the accessory 150, the communication connection lines 195a,195b (of FIG. 1), and the communication connection points 135a,135b of the mobile terminal 110) to inform the mobile terminal 110 of the current power draw of the accessory 150 (e.g., in current as measured in (milli)amps).

When the present invention is realized in conjunction with a mobile terminal as illustrated in FIGS. 1–3, the remaining standby time of the mobile terminal is very important information to provide to the user. As alluded to above, it is especially difficult to produce an accurate prediction because the power consumption varies all of the time (e.g., as a result of the distance between the mobile terminal and a base station). Nevertheless, the remaining standby time may be estimated in any of a number of ways. The technique addressed above with reference to FIGS. 3A and 3B measures the current power consumption and, from that measurement, calculates the remaining standby time. This has, however, a side effect: power is "lost" in the measuring circuits (e.g., the (internal) power draw determiner 330 and the power draw determiner 360). An alternative technique is to calculate power consumption by knowing current operation parameters (e.g., transmitter power, lights on/off, and so on). In other words, the current power consumption may be calculated from system operational parameters. From this calculation, the power consumption of only the mobile terminal itself is obtained absent the teachings of the present invention. However, this alternative may be extended to the accessory connected to the mobile terminal in accordance with the present invention.

Referring now to FIG. 3C, exemplary functional blocks for another exemplary mobile terminal in accordance with the present invention are illustrated. In the mobile terminal 110 (of FIG. 3C), the (internal) power draw determiner 330 (of FIG. 3A) is replaced with an (internal) operational parameter determiner 330'.

Referring now to FIG. 3D, exemplary functional blocks of another exemplary accessory in accordance with the present invention are illustrated. In the accessory 150 (of FIG. 3D), the power draw determiner 360 (of FIG. 3B) is replaced with an operational parameter determiner 360'.

Referring now to FIG. 3E, an exemplary memory element of the exemplary mobile terminal of FIG. 3C in accordance with the present invention is illustrated generally at 370. The memory element 370, which is part of the mobile terminal 110 (of FIG. 3C), may be, for example, nonvolatile random access memory that is read-only, re-writable memory, etc. The memory element 370 links various operational parameters of the mobile terminal 110 with the associated current draw. For example, a backlighting that is on may be associated with "x" mA.

Referring now to FIG. 3F, an exemplary memory element of the exemplary accessory of FIG. 3D in accordance with the present invention is illustrated generally at 375. The memory element 375, which is part of the accessory 150 (of FIG. 3D), may be, for example, nonvolatile random access memory that is read-only, re-writable memory, etc. The memory element 375 links various operational parameters of the accessory 150 with the associated current draw and/or current code. For example, a given processing state for the accessory 150 may be associated with "y" mA and/or "z" code. The current code may be provided to the mobile terminal 110 in lieu of the current draw if, for example, the memory element 370 includes an entry linking the current code of the accessory 150 to a current draw.

Figure 4A:
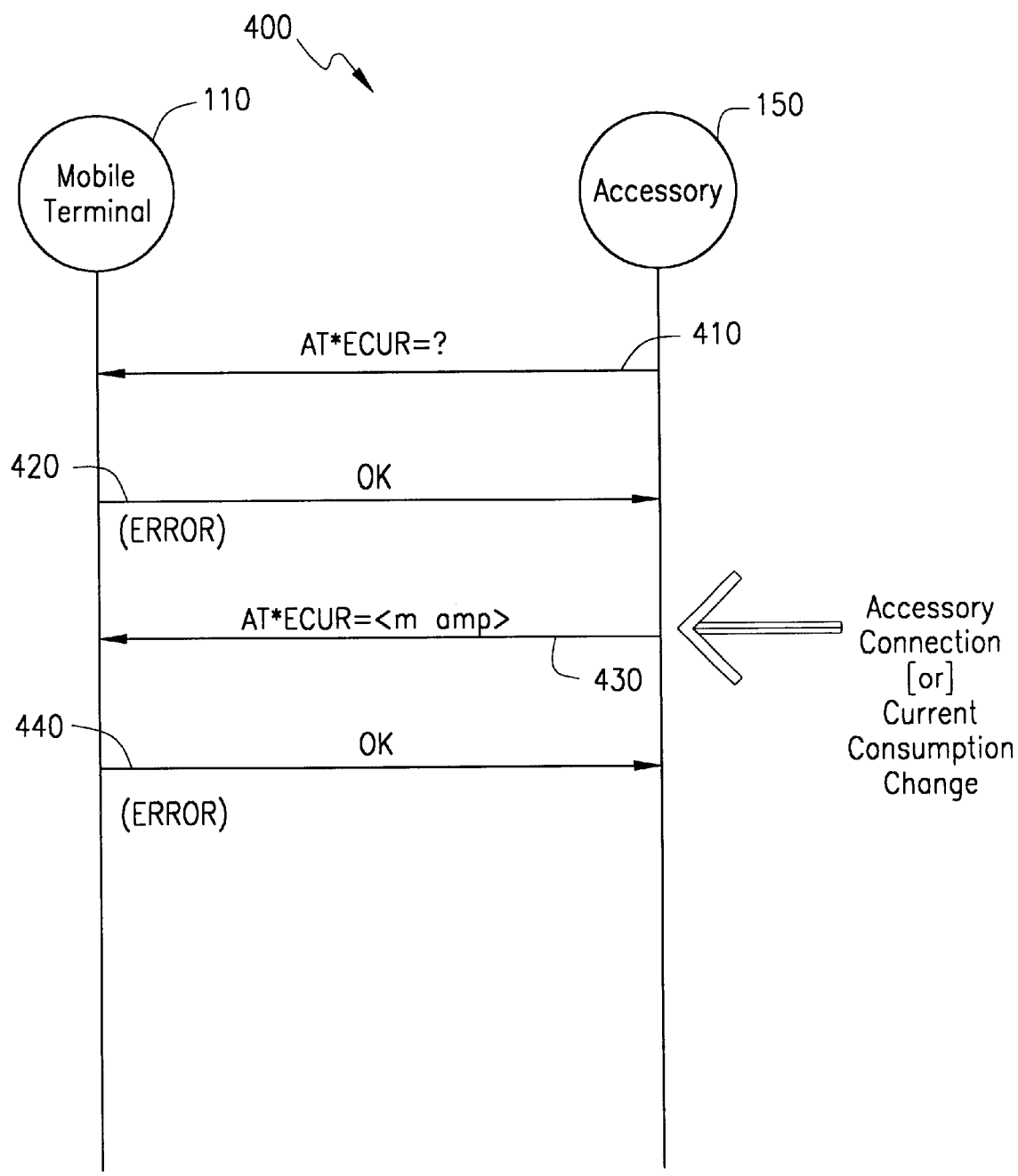
FIG. 4A illustrates an exemplary sequence diagram of signals/information exchanged between a mobile terminal and an accessory in accordance with one embodiment of the present invention.

Referring now to FIG. 4A, an exemplary sequence diagram of signals/information exchanged between a mobile terminal and an accessory in accordance with one embodiment of the present invention is illustrated generally at 400. The accessory 150 may (optionally) begin the exchange with an "AT*ECUR=?" signal/information (e.g., command, request, etc.) 410 transmitted to the mobile terminal 110. Referring now to FIG. 4B, an exemplary command structure for exchanging signals/information between the mobile terminal and the accessory of FIG. 4A in accordance with the present invention is illustrated generally at 450.

Specifically, an exemplary "AT*ECUR" command structure 450 that may be used in accordance with the principles of the present invention is illustrated. An exemplary command syntax is shown at 460. This command may be used to report to the mobile terminal the current consumption for a connected device (e.g., an accessory). The current value reported may be used to adjust the mobile terminal's charging parameters or to determine a total current drain. When the external device is connected, for example, the AT command may be initially generated. It may also be sent, for example, if the externally connected device changes current consumption. Furthermore, it may also be sent as a mean value at regular intervals. One command communicates the current consumption information while another command determines whether the "AT*ECUR" command is supported. Each command may cause either an "OK" or an "ERROR" response. An exemplary "<mamp>:parameter" definition is shown at 470. This "AT*ECUR" command may be used to report to the mobile terminal the current consumption for a connected device as an integer. Dividing the reported integer by "10" provides the current consumption in milliamps, in this exemplary embodiment. An example of an "AT*ECUR" command exchange communicating 12 mA from the connected device (e.g., accessory 150) to the mobile terminal 110 is shown at 480. It should be noted that the constant "10" may be any number, and that it depends, for example, on the actual physical limitations and needs of a given apparatus or system.

Continuing now with FIG. 4A, the mobile terminal 110, if configured in accordance with the present invention, may respond with an "OK" affirmative signal/information 420. If the mobile terminal 110 is not so configured or fails to understand the request, the mobile terminal 110 may respond with an "ERROR" indication. If, however, the mobile terminal 110 responds with "OK", the accessory 150 then transmits an "AT*ECUR=<mamp>" signal/information 430 to the mobile terminal 110. The "<mamp>" variable may correspond to, in one embodiment, the consumption of current (e.g., in amperage). The mobile terminal 110 responds with an "OK" signal/information 440 to the accessory 150 if the current consumption was successfully received and understood. If the mobile terminal 110 does not understand a communication from the accessory 150, the mobile terminal 110 may transmit an "ERROR" indication. The signal/information 430 may be transmitted when, for example, the accessory 150 is initially connected to the mobile terminal 110. Furthermore, the information/signal 430 may be transmitted whenever the current consumption of the accessory 150 changes, at regular intervals in the form of a mean value, etc.

In another embodiment, the signal/information 430 may be transmitted to the mobile terminal 110 from the accessory 150 whenever the mobile terminal 110 requests such current consumption information/signal. In yet another embodiment, the accessory 150 may (e.g., as per an earlier request from the mobile terminal 110, automatically, etc.) transmit the current consumption information/signal 430 at periodic (e.g., scheduled, etc.) intervals.

Figure 5:
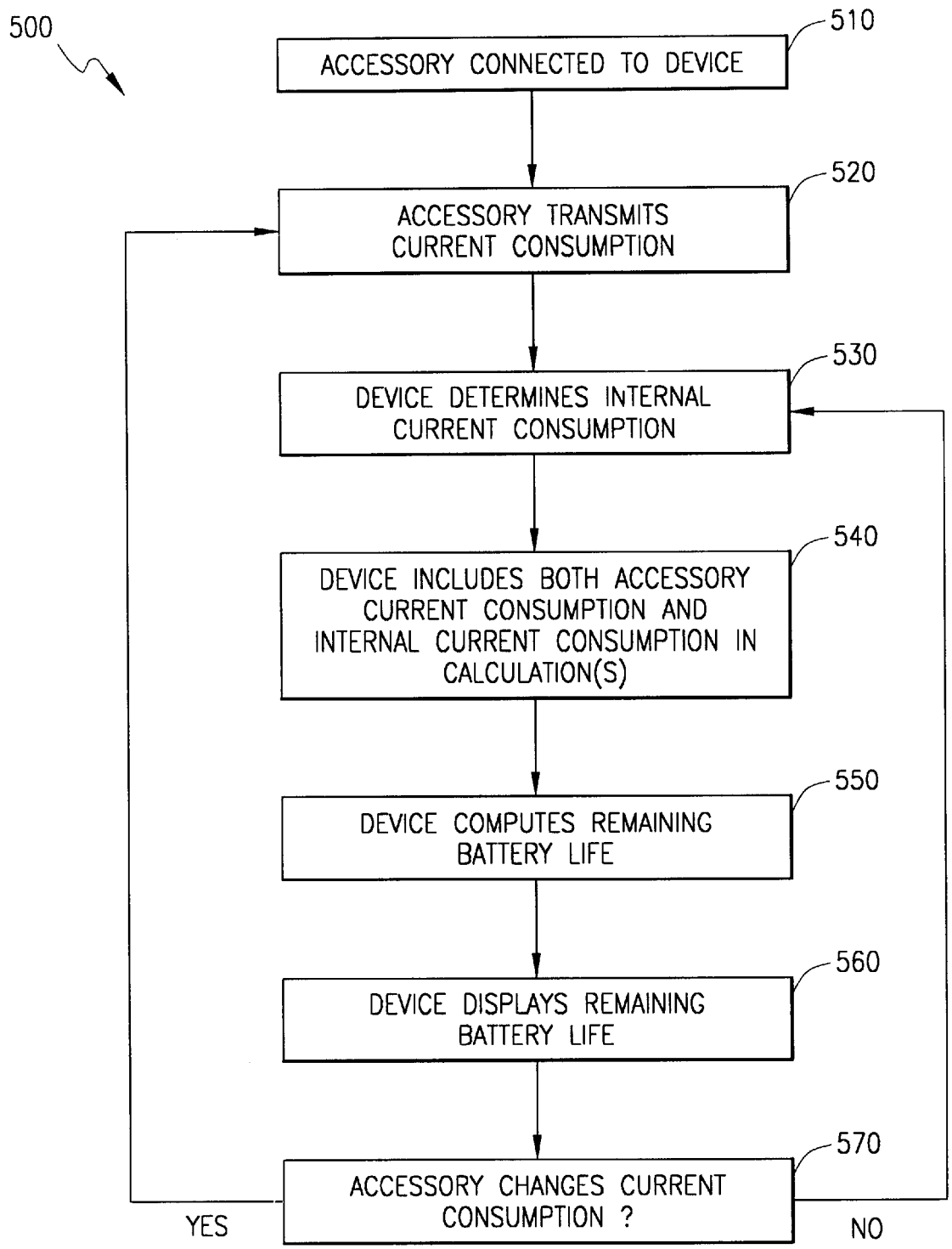
FIG. 5 illustrates an exemplary method in flowchart form for accurately computing a remaining battery life in accordance with one embodiment of the present invention.

Referring now to FIG. 5, an exemplary method in flowchart form for accurately computing a remaining battery life in accordance with one embodiment of the present invention is illustrated generally at 500. An accessory is connected to an electronic device (block 510). In response, in this example, the accessory responds by transmitting a current consumption of the accessory to the electronic device (block 520). It should be noted that in block 520 the accessory may transmit any energy-related indicator(s). For example, instead of (or in addition to) current consumption, the accessory may transmit any general power-related consumption information, a set of operating parameters (e.g., in the form of a code, etc.) from which the electronic device (e.g., the mobile terminal 110) may calculate an energy consumption (e.g., because the mobile terminal 110 stores information linking a particular operating parameter with a particular energy consumption). In such alternative embodiments, the electronic device may determine current consumption from the received energy-related indicator(s).

The electronic device determines an internal current consumption (e.g., by measuring a current draw, by knowing current draw(s) of active operational parameter(s), etc.) (block 530). The electronic device includes both the accessory current consumption and the internal current consumption in the calculation(s) for total current consumption (block 540). The electronic device then computes remaining battery life (block 550). The remaining battery life is subsequently displayed by the electronic device (block 560). It should be noted that in block 560 the electronic device (e.g., a mobile terminal) may provide notification to the user in a manner other than a visual display. For example, the electronic device may vibrate at a predetermined level of remaining battery time, it may sound a characteristic audible noise (e.g., such as a predetermined tone or a predetermined number of beeps, etc.), etc. In this example, if the accessory changes current consumption (and so notifies the electronic device) (at block 570), the method of the flowchart 500 may return to block 520. If, on the other hand, the accessory does not change current consumption (at block 570), the method of the flowchart 500 may return to block 530.

Figure 6A:
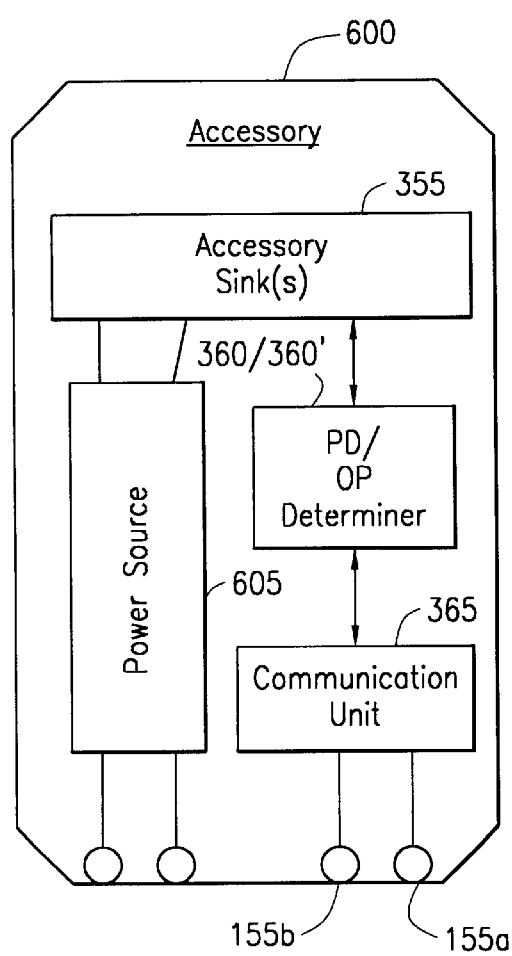
FIG. 6A illustrates exemplary functional blocks of an exemplary accessory in accordance with another embodiment of the present invention.

Referring now to FIG. 6A, exemplary functional blocks of an exemplary accessory in accordance with another embodiment of the present invention is illustrated generally at 600. In this embodiment, the accessory may also have a battery 605. The accessory 600 may have no ability to directly communicate to a user the amount of time remaining for the battery 605 to supply power. Consequently, in this embodiment, the accessory 600 transmits to a connected mobile terminal (not explicitly shown) or any general electronic device information related to a remaining power supply. The transmission may be sent from the communication connection points 155a,155b to the mobile terminal. Especially in this embodiment, the communication connection points 155a,155b may be realized (in addition to mechanical, metallic connection points, etc.) as an IR input/output port, a short range radio frequency transceiver (e.g., a Bluetooth transceiver), etc. The accessory may also include a power draw determiner 360 and/or an operational parameter determiner 360' (e.g., along with a memory element 375) in order to determine a power consumption.

In one alternative of this embodiment, the information related to the remaining power supply may correspond to the amount of time remaining in the life of the accessory's battery 605 so that the mobile terminal may communicate (e.g., display) the amount of time remaining in the life of the accessory's battery 605 to the user. In another alternative of this embodiment, the accessory 600 may transmit the current consumption and (optionally) the remaining total charge in the battery 605 to the mobile terminal. The mobile terminal may thereafter determine the remaining life in the battery 605 and communicate such remaining life to the user.

Figure 6B:
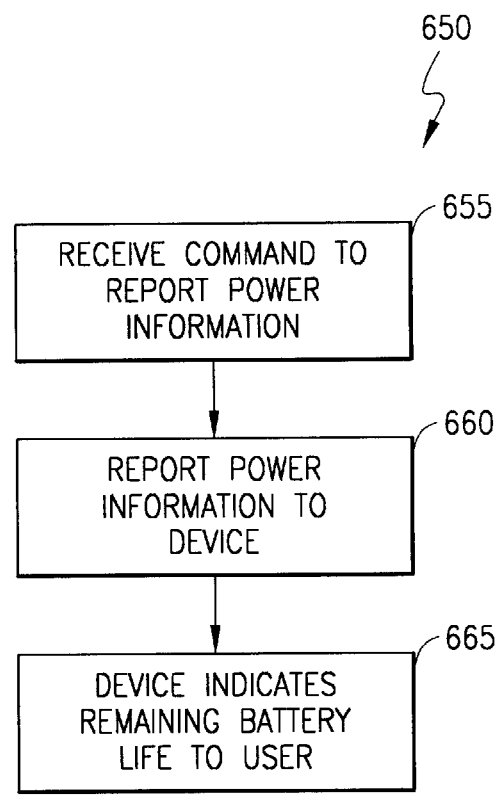
FIG. 6B illustrates an exemplary method in flowchart form of the embodiment of FIG. 6A in accordance with the present invention.

Referring now to FIG. 6B, an exemplary method in flowchart form of the embodiment of FIG. 6A in accordance with the present invention is illustrated generally at 650. The accessory receives a command to report power information (block 655). The command may be received from an electronic device, from a user directly commanding the accessory to report power information, from an integrated circuit internal to the accessory (e.g., at regular intervals, when the current consumption changes, etc.), etc. The accessory reports power information to the electronic device (block 660). The power information may include remaining battery life, a total charge along with a current consumption (e.g., as measured, as determined from operational parameters, etc.), a list of operational parameter(s), etc. After any appropriate calculation, memory look-up, etc. as needed, the electronic device indicates the remaining battery life to the user (block 665). The indication may be, for example, visual, audible, feelable, etc.

Although preferred embodiment(s) of the method, system, and apparatus of the present invention have been illustrated in the accompanying Drawings and described in the foregoing Detailed Description, it will be understood that the present invention is not limited to the embodiment(s) disclosed, but is capable of numerous rearrangements, modifications, and substitutions without departing from the spirit and scope of the present invention as set forth and defined by the following claims.

What is claimed is:

1. A method for determining remaining battery life of a battery used in a system and for reporting an indication relating to remaining battery life to a user, said system including an electronic device, an accessory for said electronic device and operatively connected to said electronic device, and said battery, said method comprising:

said accessory determining information relating to power consumption of said battery by said accessory;

said accessory transmitting said information to said electronic device; and said electronic device reporting said indication relating to remaining battery life of said battery to said user, said indication based, at least in part, on said transmitted information.

2. The method according to claim 1, wherein said battery is included in said electronic device, and wherein said method further includes the step of said electronic device calculating remaining battery life based, at least in part, on said transmitted information.

3. The method according to claim 2, wherein said step of calculating remaining battery life further comprises the step of calculating said remaining battery life based, at least in part, on power consumption of said electronic device.

4. The method according to claim 2, wherein said step of transmitting information relating to power consumption of said battery comprises the step of transmitting a current consumption.

5. The method according to claim 2, wherein said step of transmitting information relating to power consumption of said battery comprises the step of transmitting said information using a predetermined command format.

6. The method according to claim 5, wherein said predetermined command format comprises an AT command format.

7. The method according to claim 2, wherein said step of transmitting information relating to power consumption of said battery is performed when at least one of an accessory connection to said electronic device and an accessory power consumption change occur.

8. The method according to claim 2, further comprising the steps of:

monitoring, by said accessory, at least one operational parameter of said accessory;

detecting that said at least one operational parameter is in an active state; and determining said information relating to power consumption based, at least in part, on said at least one operational parameter.

9. The method according to claim 2, further comprising the steps of:

monitoring, by said accessory, at least one operational parameter of said accessory;

detecting that said at least one operational parameter is in an inactive state; and determining said information relating to power consumption considering said at least one operational parameter.

10. The method according to claim 2, further comprising the steps of:

monitoring, by said electronic device, at least one operational parameter of said electronic device;

detecting that said at least one operational parameter is in an active state;

determining a power consumption of said battery based, at least in part, on said at least one operational parameter; and wherein said step of calculating remaining battery life further comprises the step of calculating remaining battery life based, at least in part, on said power consumption of said battery.

11. The method according to claim 2, wherein said step of transmitting information relating to power consumption of said battery comprises the step of transmitting a mean current consumption at regular intervals.

12. The method according to claim 1, wherein said reporting step comprises the step of reporting said indication relating to remaining battery life via an output of a man-machine interface (MMI) of said electronic device.

13. The method according to claim 12, wherein said MMI of said electronic device comprises at least one of (i) a display and (ii) a recorded or a synthetic voice.

14. The method according to claim 1, wherein said electronic device comprises a mobile terminal.

15. The method according to claim 1, wherein said accessory comprises at least one of an infrared adapter unit, a portable handsfree unit, a vibrating notification unit, a radio frequency transceiver, and a Bluetooth adapter.

16. The method according to claim 1, wherein said battery is included in said accessory.

17. The method according to claim 16, wherein said transmitted information comprises a duration of remaining life of said battery.

18. The method according to claim 16, wherein said transmitted information comprises at least one of a current consumption of said accessory and a total charge of said battery, and said reporting step comprises the step of reporting a derivation of power consumption to said user.

19. The method according to claim 16, wherein said step of reporting said indication relating to remaining battery life comprises the step of displaying at least one of power consumption and a derivation of power consumption on a display of said electronic device.

20. The method according to claim 16, further comprising the steps of:
- monitoring by said accessory, at least one operational parameter of said accessory;
- detecting that said at least one operational parameter is in an active state;
- measuring a remaining charge of said battery; and
- determining said information relating to power consumption based, at least in part, on said at least one operational parameter and said remaining charge of said battery.

21. A system for determining remaining battery life of a battery and for reporting an indication relating to remaining battery life to a user, said system including:
- an electronic device;
- at least one accessory for said electronic device, said at least one accessory operatively connected to said electronic device;
- a battery for powering at least said at least one accessory;
- said at least one accessory including a determiner which determines information relating to power consumption of said battery by said at least one accessory;
- a communication link between said electronic device and said at least one accessory, said at least one accessory transmitting said information relating to power consumption to said electronic device via said communication link; and
- said electronic device reporting an indication relating to remaining battery life of said battery to said user based, at least in part, on said transmitted information.

22. The system according to claim 21, wherein said battery is included in said electronic device, and wherein said electronic device includes at least one logic module for computing remaining battery life, and wherein said at least one logic module computes said remaining battery life based, at least in part, on said transmitted information.

23. The system according to claim 22, wherein said at least one logic module computes said remaining battery life based, at least in part, on a current consumption of said at least one accessory and an internal current consumption of said electronic device.

24. The system according to claim 23, wherein said internal current consumption of said electronic device is determined by considering at least one internal operation parameter, said at least one internal operation parameter comprising at least one of transceiving power, display status, and keypad lighting status.

25. The system according to claim 22, wherein said electronic device further includes at least one memory element, said at least one memory element having at least one entry that links at least one operational parameter to a corresponding current consumption.

26. The system according to claim 25, wherein said at least one operational parameter corresponds to an operational parameter of said at least one accessory.

27. The system according to claim 25, wherein said at least one operational parameter corresponds to an operational parameter of said electronic device.

28. The system according to claim 22, wherein said at least one accessory includes at least one memory element, said at least one memory element having at least one entry that links at least one operational parameter to a corresponding current consumption.

29. The system according to claim 21, wherein said electronic device comprises a mobile terminal.

30. The system according to claim 21, wherein said battery is included in said at least one accessory.

31. The system according to claim 30, wherein said information relating to power consumption transmitted to said electronic device comprises information related to remaining battery life of said battery.

32. The system according to claim 30, wherein said information relating to power consumption transmitted to said electronic device comprises a current consumption and a total remaining charge of said battery, said electronic device determining said remaining battery life of said battery therefrom.

33. The system according to claim 30, wherein said determiner measures current consumption by said at least one accessory.

34. The system according to claim 30, wherein said current consumption is determined from monitoring at least one operational parameter of said at least one accessory, said at least one operational parameter known to correspond to a predetermined current consumption.

35. An accessory for an electronic device, comprising:
- at least one power drain;
- a monitoring unit which monitors an operational parameter associated with said at least one power drain and determines when said at least one power drain is draining power;
- at least one memory element, said at least one memory element including at least one entry linking said operational parameter with a corresponding current consumption; and
- a communication unit for transmitting said corresponding current consumption to said electronic device.

36. The accessory according to claim 35, further comprising:
- a battery; and
- a calculation unit for determining a remaining battery life of said battery based, at least in part, on said corresponding current consumption; and wherein
  said communication unit transmits said remaining battery life of said battery to said electronic device.

* * * * *